United States Patent [19]
Capps, Jr. et al.

[11] Patent Number: 6,016,517
[45] Date of Patent: Jan. 18, 2000

[54] DATA PROCESSING SYSTEM AND METHOD FOR OPTIMIZING CONNECTOR USAGE

[75] Inventors: Louis Bennie Capps, Jr., Round Rock; Robert Christopher Dixon, Austin; Josefina Santiago Drerup, Austin; Thoi Nguyen, Austin, all of Tex.

[73] Assignee: International Business Machines Corporation, Armonk, N.Y.

[21] Appl. No.: 08/827,743

[22] Filed: Apr. 10, 1997

[51] Int. Cl.[7] .................................................. G06F 13/00
[52] U.S. Cl. .............................. 710/1; 710/100; 712/229
[58] Field of Search ..................................... 395/800, 829, 395/725, 821, 430, 560, 305; 340/146; 710/1, 5, 8, 20, 23, 31, 100, 101, 104, 131; 712/32, 229

[56] References Cited

U.S. PATENT DOCUMENTS

| | | | |
|---|---|---|---|
| 4,504,821 | 3/1985 | Barnes | 340/146 |
| 4,839,795 | 6/1989 | Iwaksaki | 364/200 |
| 4,843,588 | 6/1989 | Flynn | 364/900 |
| 4,972,470 | 11/1990 | Farago | 380/3 |
| 5,101,498 | 3/1992 | Ehlig et al. | 395/800 |
| 5,159,688 | 10/1992 | Matsushima et al. | 395/725 |
| 5,237,131 | 8/1993 | Catlin | 174/261 |
| 5,400,389 | 3/1995 | Niiyama et al. | 379/58 |
| 5,410,305 | 4/1995 | Barrus et al. | 341/22 |
| 5,465,106 | 11/1995 | Keech et al. | 345/204 |
| 5,487,161 | 1/1996 | Koenck et al. | 395/442 |
| 5,488,705 | 1/1996 | LaBarbera | 395/305 |
| 5,491,830 | 2/1996 | Ferri | 395/829 |
| 5,537,295 | 7/1996 | Van Den Bout et al. | 361/767 |
| 5,590,373 | 12/1996 | Whitley et al. | 395/828 |
| 5,659,773 | 8/1997 | Huynh et al. | 710/1 |
| 5,671,433 | 9/1997 | Fung et al. | 395/800 |
| 5,687,346 | 11/1997 | Shinohara | 395/430 |
| 5,764,968 | 6/1998 | Ninomiya | 395/560 |
| 5,805,030 | 8/1998 | Dhuey et al. | 333/1 |
| 5,872,999 | 2/1999 | Koizumi et al. | 710/72 |

*Primary Examiner*—Thomas C. Lee
*Assistant Examiner*—Rijue Mai
*Attorney, Agent, or Firm*—Winstead Sechrest & Minick P.C.; Volel Emile, Esq.

[57] ABSTRACT

A connector on a printed circuit board of a computer system is reused to reduce a number of connectors utilized on a motherboard of a computer system. By recognizing that some signals are common between a programming application performed during a manufacturing process and a second application performed while the computer system is a normal customer operation, the connector may be used to provide data values during both the manufacturing process and normal customer operation. Stated another way, data signals used to drive programmed data during the manufacturing process may be re-used to provide serial data to an input/output device during normal customer operation.

20 Claims, 3 Drawing Sheets

DATA PROCESSING SYSTEM AND METHOD FOR OPTIMIZING CONNECTOR USAGE

TECHNICAL FIELD

The present invention relates in general to connector usage in a data processing systems, and in particular, to an apparatus and method for optimizing connector usage in a data processing system.

BACKGROUND INFORMATION

During the process of manufacturing computer systems, internal semiconductor devices on logic boards within the computer systems may be programmed using a special programming connector. The connector interfaces between programmable logic circuitry on a logic board having a central processing unit, which is referred to as a motherboard, and an external programming device. Internally, on the motherboard, the connector is connected to the programmable logic circuitry to provide the appropriate control signals for programming the logic in a useful manner. Because the programming connector is designed for programming operations, the connector becomes useless after the programming operation is performed and the programmable logic circuitry is programmed. In this situation, the special programming connector requires space on the motherboard and, therefore, this space may not be used for any other purpose even after the programming operation is executed. Such dedicated space results in inefficient use of the motherboard resources. Furthermore, as different devices are increasingly added to computers, a number of connectors on a motherboard increases. This increase in the number of connectors is also augmented by the fact that computer vendors are currently implementing computer system designs in which motherboards may be shared across several types of products. Such implementations of computer systems having a common motherboard increases a number of connectors on that motherboard, even though all connectors are not necessarily in use at a given time. The presence of connectors which are no longer usable on a motherboard results in an inefficient use of space on that motherboard. Furthermore, the extra unused connectors are confusing to a user who is installing new devices in the data processing system.

Therefore, a need exists for an apparatus and method for reducing a number of connectors in a system, while maintaining the functionality provided by the connectors currently implemented on most motherboards.

SUMMARY OF THE INVENTION

The previously mentioned needs are fulfilled with the present invention. Accordingly, there is provided, in a first form, a printed circuit board. The printed circuit board includes a first device for performing a first function during a first mode of operation and a second device for performing a second function during a second mode of operation. A connector is connected to the first device to provide a first plurality of information values during the first mode of operation and the connector is connected to the second device to provide a second plurality of information values during the second mode of operation.

Additionally, there is provided, in a second form, a data processing system. The data processing system includes a data communication device for providing a first plurality of data values during a first mode of operation and a printed circuit board. The printed circuit board includes a first device for performing a first function during the first mode of operation and a second device for performing a second function during a second mode of operation. A connector is connected to the first device to provide a first plurality of information values during the first mode of operation and the connector is connected to the second device to provide a second plurality of information values during the second mode of operation.

Furthermore, there is provided, in a third form, a method for operating a data processing system. The method includes the steps of performing a first function using a first device during a first mode of operation of the data processing system and performing a second function using a second device during a second mode of operation of the data processing system. The method also includes the steps of connecting a connector to the first device to provide a first plurality of information values during the first mode of operation and connecting the connector to the second device to provide a second plurality of information values during the second mode of operation.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
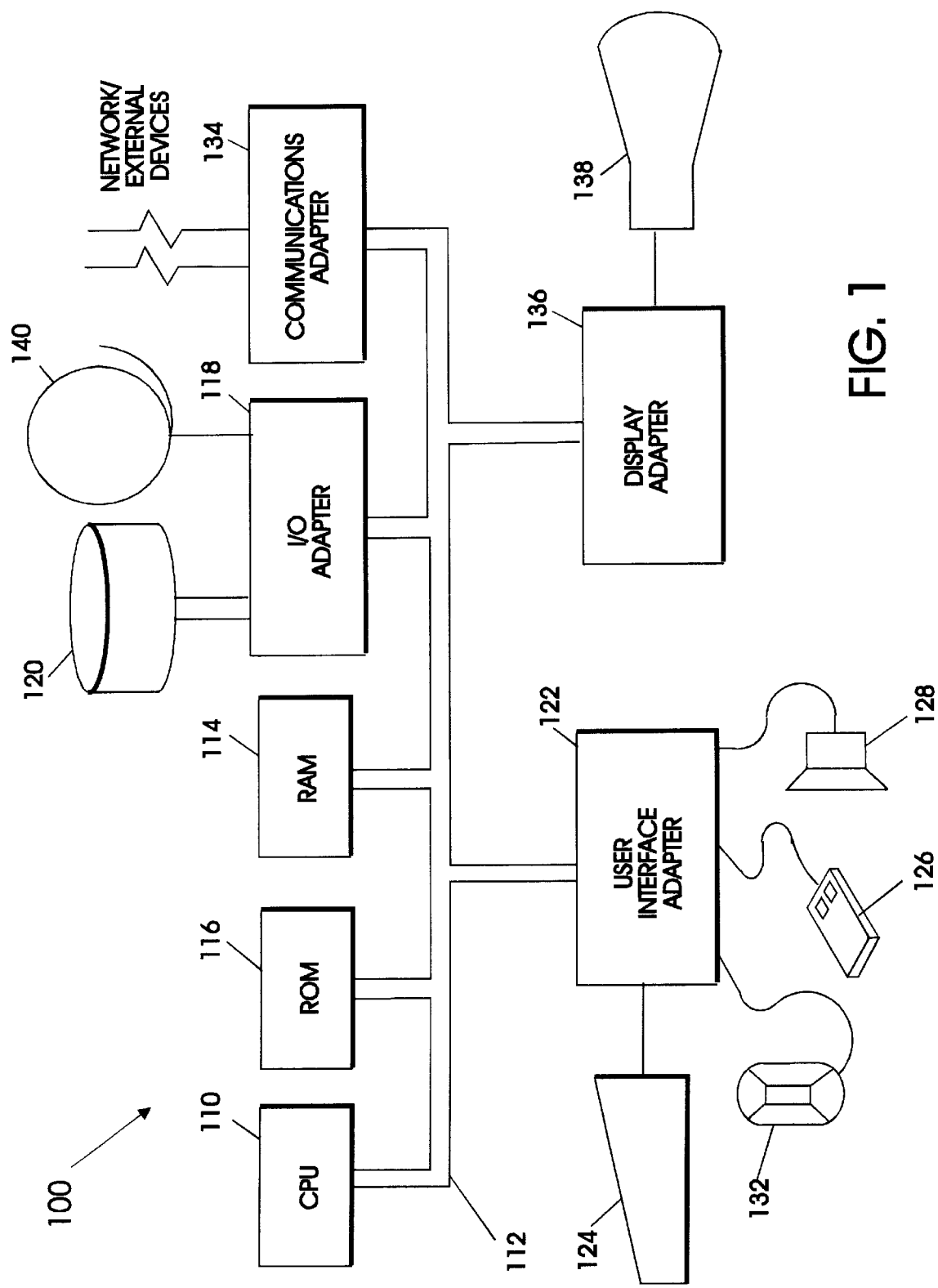
FIG. 1 illustrates, in block diagram form, the data processing system in accordance with one embodiment of the present invention.

As previously discussed, computer systems comprise many devices which require cables to provide signals from a motherboard of the data processing system to individual devices within that system. Such signals may be used for transferring information or power signals, among others. As different types of devices are added to computer systems, the number of connectors on a motherboard also increases to ensure that the devices may communicate with the central processing unit of the computer. Additionally, as computer vendors are trying to make motherboard designs substantially interchangeable, a number of connectors on a motherboard in a particular system increases since connectors required in one computer system configuration may not be required in another.

A connector which is typically not used on a motherboard of a computer system after the computer system is sold is the connector commonly used to program programmable logic on the motherboard during the manufacturing process. During this process, the connector is used to provide program control and data information to the programmable logic on the motherboard. However, in typical computer systems, after the connector provides signals to the programmable logic on the motherboard, the connector is no longer used and merely consumes space on the motherboard which could be used for other purposes.

The present invention recognizes that this connector may be used to provide some signals to other devices in the computer system during normal customer operation. By recognizing that this connector may be re-used, the present invention may be used to reduce a number of connectors utilized on the motherboard of the computer system. The present invention recognizes that some signals are common between the programming application performed during the manufacturing process and a second application performed while the computer system is used in normal customer operation. Examples of such common signals include power and ground signals. Furthermore, data signals used to drive programmed data during the manufacturing process, may be re-used to provide serial data to an input/output device during normal customer operation in one embodiment of the invention.

The foregoing discussion provides a general description of operation of the present invention. However, a more detailed description will be provided below.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, an example is shown of a data processing system 100 which may be used for the invention. The system has a central processing unit (CPU) 110, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor Users Manual", 1994, IBM Corporation, which is hereby incorporated herein by reference. The history buffer (not shown) of the present invention is included in CPU 110. The CPU 110 is coupled to various other components by system bus 112. Read only memory ("ROM") 116 is coupled to the system bus 112 and includes a basic input/output system ("BIOS") that controls certain basic functions of the data processing system 100. Random access memory ("RAM") 114, I/O adapter 118, and communications adapter 134 are also coupled to the system bus 112. I/O adapter 118 may be a small computer system interface ("SCSI") adapter that communicates with a disk storage device 120. Communications adapter 134 interconnects bus 112 with an outside network enabling the data processing system to communication with other such systems. Input/Output devices are also connected to system bus 112 via user interface adapter 122 and display adapter 136. Keyboard 124, track ball 132, mouse 126 and speaker 128 are all interconnected to bus 112 via user interface adapter 122. Display monitor 138 is connected to system bus 112 by display adapter 136. In this manner, a user is capable of inputting to the system throughout the keyboard 124, trackball 132 or mouse 126 and receiving output from the system via speaker 128 and display 138. Additionally, an operating system such as AIX ("AIX" is a trademark of the IBM Corporation) is used to coordinate the functions of the various components shown in FIG. 1.

Preferred implementations of the invention include implementations as a computer system programmed to execute the method or methods described herein, and as a computer program product. According to the computer system implementation, sets of instructions for executing the method or methods are resident in the random access memory 114 of one or more computer systems configured generally as described above. Until required by the computer system, the set of instructions may be stored as a computer program product in another computer memory, for example, in disk drive 120 (which may include a removable memory such as an optical disk or floppy disk for eventual use in the disk drive 120). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting or other terms that could be associated with a human operator. However, for at least a number of the operations described herein which form part of the present invention, no action by a human operator is desirable. The operations described are, in large part, machine operations processing electrical signals to generate other electrical signals.

Figure 2:
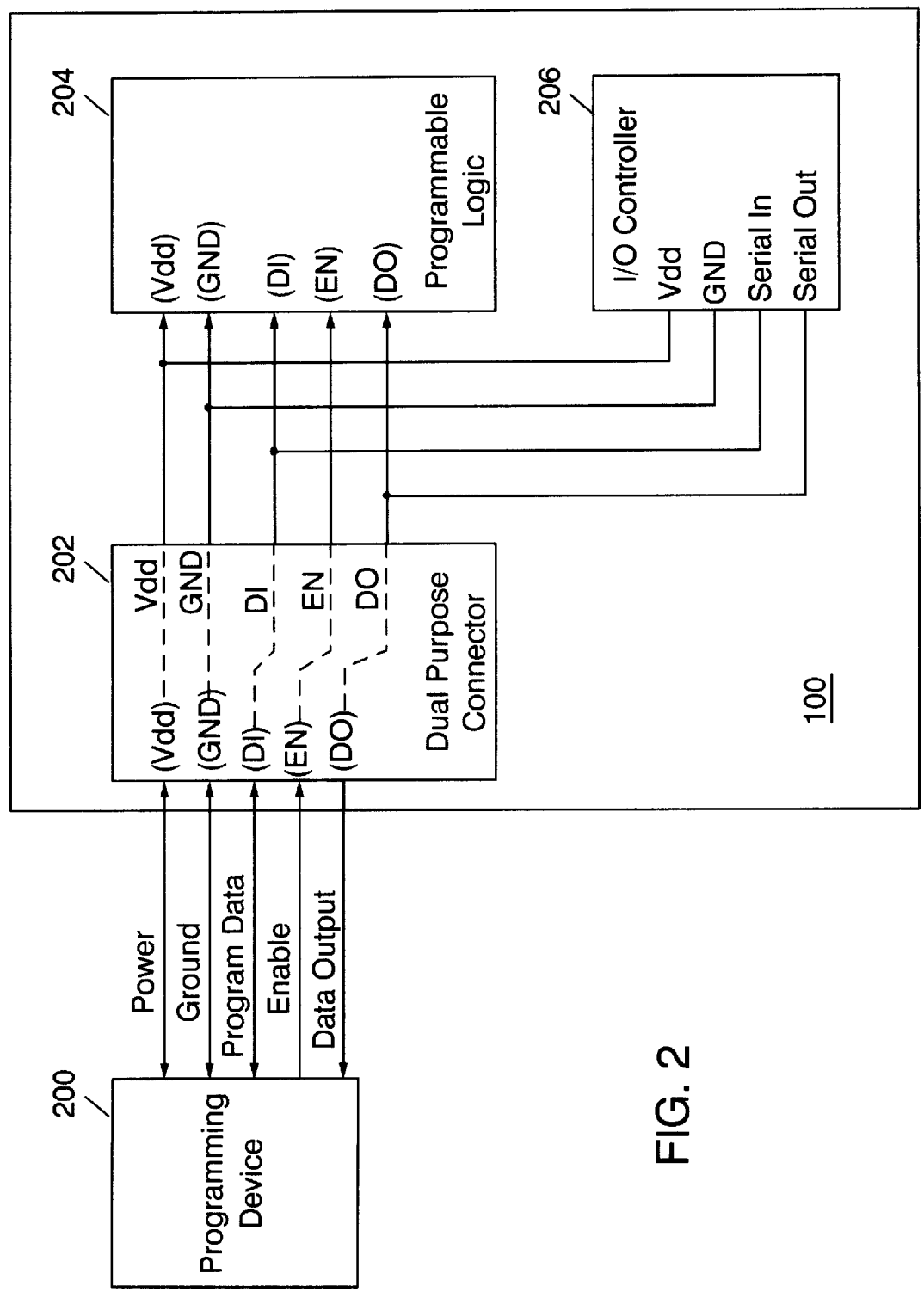
FIG. 2 illustrates, in block diagram form, a first embodiment of a connector utilized in accordance with one embodiment of the present invention.

In one embodiment of the present invention, the dual purpose connector of the present invention may be implemented as a connector to communications adapter 134 or I/O adapter 118 of FIG. 1, depending upon an application in which it is utilized. FIG. 2 illustrates the dual purpose connector of the present invention and its interconnections during a manufacturing process in which programmable logic within data processing system 100 is being programmed by an external programming device.

As illustrated in FIG. 2, a programming device 200 is coupled to a dual purpose connector 202 to provide a plurality of power and data signals. For example, programming device 200 is coupled to a Vdd input of dual purpose connector 202 to provide a power signal, and is coupled to a GND input of dual purpose connector 202 to provide a ground signal. Programming device 200 is also coupled to a DI input of dual purpose connector 202 to provide a plurality of program data values. Additionally, programming device 200 is coupled to an EN input of dual purpose connector 202 to provide an enable signal. As well, programming device 200 is coupled to a DO output of dual purpose connector 202 to receive a data output signal.

Within dual purpose connector 202, the power signal provided by programming device 200 is routed to a Vdd output of dual purpose connector 202 which is connected to a Vdd input of programmable logic 204 and a Vdd input of controller 206. Similarly, the ground signal is routed through dual purpose connector 202 to a GND output. The GND output of dual purpose connector 202 is coupled to a GND input of programmable logic 204 and a GND input of I/O controller 206. Additionally, the plurality of program data values received at the DI input of dual purpose connector 202 is routed to a DI input of programmable logic 204 and a Serial In input of I/O controller 206 via a DI output of dual purpose connector 202. As well, programming device 200 provides an enable signal to programmable logic 204 via an EN input and EN output of dual purpose connector 202. Lastly, programming device 200 receives a plurality of data output values from a DO output of dual purpose connector 202. The DO output of dual purpose connector 202 is coupled to a DO input of said connector 202, which in turn is coupled to a DO output of programmable logic 204 and a Serial Out output of I/O controller 206.

By providing a means for routing power and data signals from programming device 200 to programmable logic 204, dual purpose connector 202 is essential in programming programmable logic 204 during the manufacturing process. For example, when programming device 200 asserts an enable signal, dual purpose connector 202 provides the asserted enable signal to an EN (enable) input of programmable logic 204. When its enable input is asserted, programmable logic 204 is enabled to program data in response to the plurality of program data values received at its DI input. Such programming techniques are well-known to those with skill in the data processing art and will not be described in greater detail herein. Furthermore, it should be noted that I/O controller 206 is not enabled during the programming step of the manufacturing process.

Note that I/O controller 206, while implemented within data processing system 100, is not utilized during this programming step of the manufacturing process. However, I/O controller 206 is integral to normal customer use and, therefore, will require a connection to an external I/O device during such normal customer use.

Figure 3:
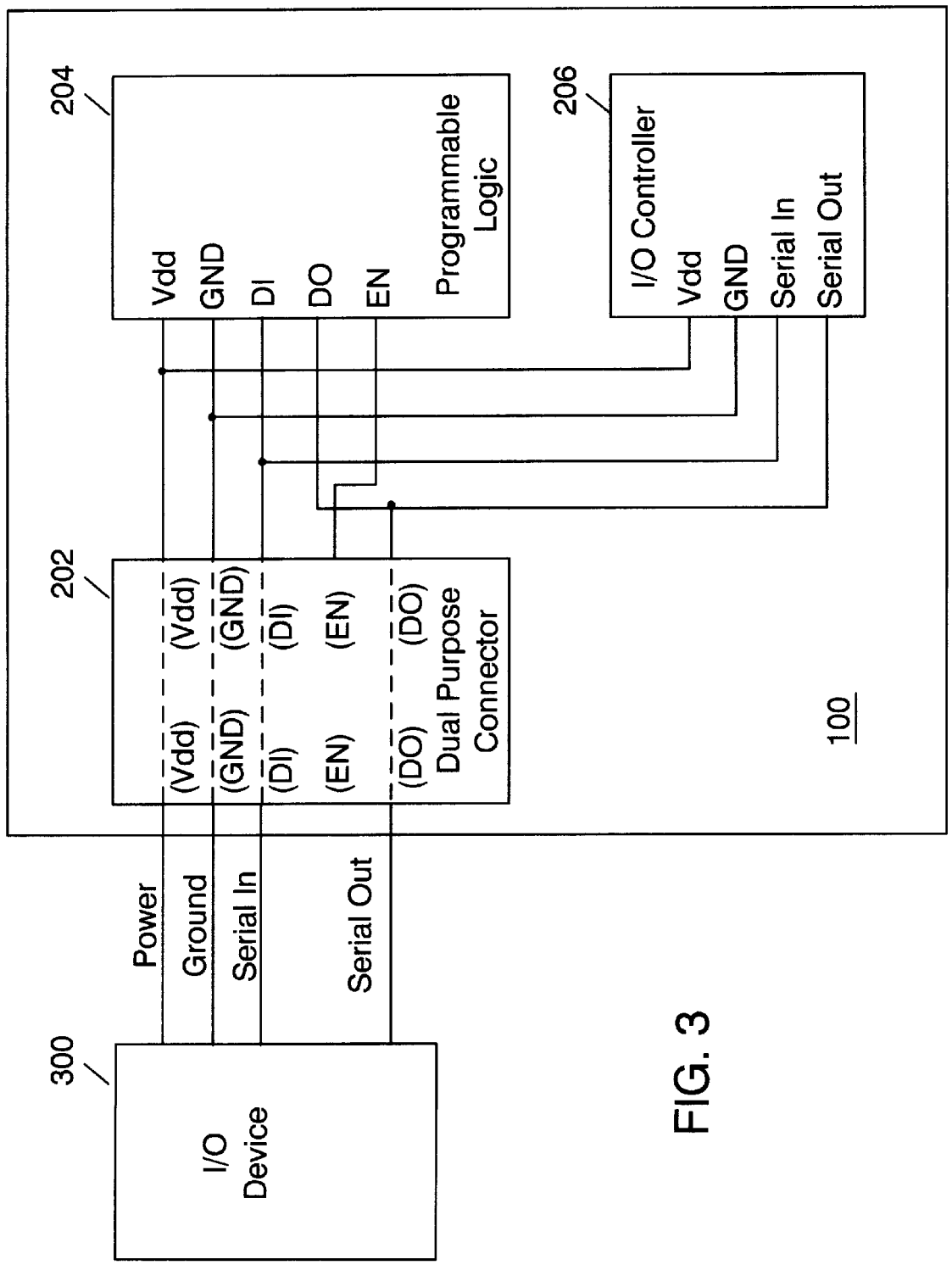
FIG. 3 illustrates, in block diagram form, a second embodiment of a connector utilized in accordance with one embodiment of the present invention.

FIG. 3 illustrates a use for dual purpose connector 202 during another form of operation, including normal customer operation. To connect dual purpose connector 202 in this configuration, a cable is manually moved from programming device 200 to an I/O device 300. Dual purpose connector 202 is, however, still utilized to perform a connection function and is not required to remain unused and inactive as is required in typical prior art solutions. The present invention recognizes that an output of dual purpose connector 202 may be repositioned, in response to a new external input, such that dual purpose connector 202 may be reused.

For example, as illustrated in FIG. 3, I/O device 300 provides a power signal, a ground signal, and a serial in signal. Additionally, I/O device 300 receives a serial out signal. The power signal and ground signal provided by I/O device 300 may be respectively coupled to the Vdd and GND inputs of dual purpose connector 202. Each of these signals is passed through dual purpose connector 202 to both programmable logic 204 and I/O controller 206. Additionally, I/O device 300 provides serial data to data processing system 100. The serial data provided by I/O device 300 may be provided to the DI input of dual purpose connector 202. The DI input is subsequently routed to the DI output of dual purpose connector 202, where it is connected to a serial in input of I/O controller 206. Note that before the connector between dual purpose connector 202 and I/O controller 206 was moved, the DI output of dual purpose connector 202 was coupled to a DI input of programmable logic 204. Similarly, I/O device 300 receives a serial out input from the DO output of dual purpose connector 202. The DO output is coupled to a serial output of I/O controller 206. As may be noted, previously, the DO output of dual purpose connector 202 was coupled to the data out output of programmable logic 204.

It should be noted I/O device 300 does not provide an enable (EN) signal to either programmable logic 204 or I/O controller 206. Therefore, programmable logic 204 is not enabled to perform a programming operation during a normal customer mode of operation.

By recognizing that dual purpose connector 202 may be utilized to transfer at least a portion of the signals required for other devices within data processing system 100 to devices on a single mother board, the present invention allows the connector to be re-used and space on the motherboard is more efficiently utilized.

It should be noted that the enable input of dual purpose connector 202 is not required by I/O controller 206. Therefore, the enable input is not provided to I/O controller 206, but is provided to a no connect (NC) pin on the external device to which it is coupled. Therefore, the present invention is not required to utilize all inputs and outputs of dual purpose connector 202, unless all inputs and outputs are required by a desired application and are compatible for reconnection.

While there have been described herein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. A printed circuit board, comprising:
   a first device for performing a first function during a first mode of operation;
   a second device for performing a second function during a second mode of operation; and
   a connector coupled to the first device to provide a first plurality of information values during the first mode of operation and the connector coupled to the second device to provide a second plurality of information values during the second mode of operation.

2. The printed circuit board of claim 1, wherein the first mode of operation is a programming mode of operation.

3. The printed circuit board of claim 1, wherein the second mode of operation is a normal customer mode of operation.

4. The printed circuit board of claim 1, wherein the second plurality of information values is a subset of the first plurality of information values.

5. The printed circuit board of claim 1, wherein the first device is a programmable logic circuit.

6. The printed circuit board of claim 5, wherein the first function is a programming function, wherein the first plurality of information values indicates a data value to be programmed into the first device.

7. The printed circuit board of claim 1, wherein the second device is an input/output device.

8. The printed circuit board of claim 7, wherein the second function comprises one of transferring a serial data value from the second device and receiving a serial data output value at the second device.

9. The printed circuit board of claim 1, further comprising:
   a cable for interconnecting the connector and one of the first device and the second device.

10. The printed circuit board of claim 9, wherein the cable is manually moved from between the first device and the connector to between the second device and the connector before the second device performs the second function during the second mode of operation.

11. A data processing system, comprising:
a data communication device for providing a first plurality of data values during a first mode of operation; and
a printed circuit board, wherein the printed circuit board comprises:
a first device for performing a first function during the first mode of operation;
a second device for performing a second function during a second mode of operation; and
a connector coupled to the first device to provide a first plurality of information values during the first mode of operation and the connector coupled to the second device to provide a second plurality of information values during the second mode of operation.

12. The data processing system of claim 11, wherein the data communication device comprises an input/output device.

13. The data processing system of claim 11, wherein the first mode of operation is a normal mode of operation and the second mode of operation is a programming mode of operation.

14. The data processing system of claim 11, further comprising:
a programming device for providing a plurality of program values to the connector during the second mode of operation, wherein the connector provides the plurality of program values to the second device as the second plurality of information values.

15. The data processing system of claim 14, wherein the programming device programs the second device using the plurality of program values during the second mode of operation.

16. The data processing system of claim 11, further comprising:
a cable for interconnecting the connector and one of the first device and the second device.

17. The data processing system of claim 16, wherein the cable is manually moved from between the first device and the connector to between the second device and the connector before the second device performs the second function during the second mode of operation.

18. A method for operating a data processing system, comprising the steps of:
performing a first function using a first device during a first mode of operation of the data processing system;
performing a second function using a second device during a second mode of operation of the data processing system;
coupling a connector to the first device to provide a first plurality of information values during the first mode of operation; and
coupling the connector to the second device to provide a second plurality of information values during the second mode of operation.

19. The method of claim 18, wherein the first mode of operation is a programming mode of operation and the second mode of operation is a normal customer mode of operation.

20. The method of claim 19, further comprising the step of:
placing a cable between the connector and one of the first device during the first mode of operation of the data processing system; and
manually moving the cable to interconnect the second device and the connector before the second device performs the second function during the second mode of operation.

\* \* \* \* \*